United States Patent
Lee

(10) Patent No.: US 8,791,747 B2
(45) Date of Patent: Jul. 29, 2014

(54) METHODS OF CONTROLLING STANDBY MODE BODY BIASING AND SEMICONDUCTOR DEVICES USING THE METHODS

(71) Applicant: Samsung Electronics Co., Ltd., Suwon-Si (KR)

(72) Inventor: Ki Jong Lee, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/760,614

(22) Filed: Feb. 6, 2013

(65) Prior Publication Data
US 2013/0222049 A1    Aug. 29, 2013

(30) Foreign Application Priority Data

Feb. 27, 2012    (KR) .................. 10-2012-0019845

(51) Int. Cl.
*H03K 3/01*    (2006.01)
(52) U.S. Cl.
USPC ........................... 327/534; 327/544; 327/143
(58) Field of Classification Search
USPC ......... 327/534, 530, 538, 540, 541, 543, 544, 327/143, 198; 365/185.24, 185.27, 227, 365/229
See application file for complete search history.

(56) References Cited

U.S. PATENT DOCUMENTS

| | | | |
|---|---|---|---|
| 6,512,394 B1 | 1/2003 | Parris | |
| 6,518,826 B2 | 2/2003 | Zhang | |
| 6,586,963 B2 | 7/2003 | Choi et al. | |
| 6,868,029 B2 | 3/2005 | Ooishi et al. | |
| 7,336,101 B2 * | 2/2008 | Kim | 326/81 |
| 7,847,441 B2 | 12/2010 | Tatsumi et al. | |
| 2006/0132218 A1 * | 6/2006 | Tschanz et al. | 327/534 |
| 2011/0026333 A1 | 2/2011 | Song | |
| 2011/0047397 A1 | 2/2011 | Lee | |

FOREIGN PATENT DOCUMENTS

| | | |
|---|---|---|
| JP | 4001229 B2 | 10/2007 |
| JP | 2009151573 A | 7/2009 |
| KR | 20080080834 A | 9/2008 |
| KR | 101004509 B1 | 12/2010 |

* cited by examiner

*Primary Examiner* — Lincoln Donovan
*Assistant Examiner* — Jung H Kim
(74) *Attorney, Agent, or Firm* — Harness, Dickey & Pierce, P.L.C.

(57) ABSTRACT

A semiconductor device includes a semiconductor element; a body bias controller configured to generate a standby mode body bias control signal in a standby mode; and a body bias voltage generator configured to receive the standby mode body bias control signal from the body bias controller, generate a standby mode body bias voltage, and apply the standby mode body bias voltage to a body of the semiconductor element. The semiconductor device is capable of retaining data stored in a semiconductor element and blocking leakage current in the standby mode by controlling a body bias voltage, thereby increasing the integration degree of the semiconductor device.

8 Claims, 10 Drawing Sheets

METHODS OF CONTROLLING STANDBY MODE BODY BIASING AND SEMICONDUCTOR DEVICES USING THE METHODS

CROSS-REFERENCE TO RELATED APPLICATIONS

This application claims the benefit of Korean Patent Application No. 10-2012-0019845, filed on Feb. 27, 2012, in the Korean Intellectual Property Office, the disclosure of which is incorporated herein in its entirety by reference.

BACKGROUND

Inventive concept relate to semiconductor devices, and more particularly, to a method of controlling standby mode body biasing of a semiconductor device to reduce power consumption.

In general, as the importance of the portability of electronic devices, such as a mobile phone and a camera, has been emphasized, much attention has been paid to technology of securing a maximum duration of use of electronic devices without an external power source. Many attempts have been made in various fields to secure a maximum duration of use. For example, electronic devices have been designed to include as many batteries as possible or technology improving the performances of batteries has been developed. In addition, electronic circuits included in an electronic device have been designed to improve the performances of the electronic circuits and minimize undesired power consumption or leakage current during an operation of the electronic device. Furthermore, technology improving power efficiency even while external power is supplied to an electronic device has been developed.

An electronic device may operate in any of various operation modes so as to minimize leakage current. For example, the electronic device may enter a standby mode to reduce power consumption according to a request from a user or after a predetermined time period so as to appropriately discontinue supply of power to electronic circuits in the electronic device and may then return back to a normal operation mode. The standby mode may be referred to as a sleep mode or an idle mode, according to a degree of power consumption. There is an interest in developing a technology to allow an electronic device that is in the standby mode to return back to a normal operation mode as rapidly as possible, and storing predetermined information for restoring user information before the electronic device enters the standby mode. Accordingly, development of a power gating technology whereby power consumption may be minimized and desired information may be retained in the standby mode is required.

SUMMARY

According to at least one example embodiment of inventive concepts, there is provided a semiconductor device including a semiconductor element; a body bias controller configured to generate a standby mode body bias control signal in a standby mode; and a body bias voltage generator configured to receive the standby mode body bias control signal from the body bias controller, generate a standby mode body bias voltage based on the standby mode body bias control signal, and apply the standby mode body bias voltage to a body (e.g., a body terminal, or body terminals) of the semiconductor element.

According to at least one example embodiment, the semiconductor device may further include a non-volatile memory configured to store voltage level information generated by the body bias controller and used to determine the standby mode body bias voltage to be applied to the semiconductor element.

According to at least one example embodiment, the semiconductor device further comprises a reset pad configured to receive a reset signal from a host.

According to at least one example embodiment, the semiconductor device further comprises a standby pad configured to receive a standby mode signal from a host, the standby mode signal indicating whether the standby mode is entered.

According to at least one example embodiment, the semiconductor device further comprises a standby register configured to store a standby mode bit that varies according to whether the semiconductor device enters the standby mode.

According to at least one example embodiment, the plurality of transistors included in the semiconductor element is divided into at least two groups of transistors, the bodies of each transistor in the at least two groups of transistors being connected to one another, and different standby mode body bias voltages are respectively applied to the at least two groups of transistors.

According to at least one example embodiment, the body bias controller is configured to receive a reset signal from a host, and supply the reset signal to the semiconductor element after the applying of the standby mode body bias voltage to the body of the semiconductor element is completed.

According to at least one example embodiment, the standby mode body bias voltage is different from an active mode body bias voltage, the active mode body bias voltage being applied in an active mode.

According to at least one example embodiment, there is provided a computer system including the semiconductor device.

According to at least one example embodiment of inventive concepts, there is provided a method of controlling standby mode body biasing, the method including enabling a standby mode; generating a standby mode body bias control signal if the standby mode is enabled, performed by a body bias controller; and generating a standby mode body bias voltage and applying the standby mode body bias voltage to a body of a semiconductor element according to the standby mode body bias control signal, performed by a body bias voltage generator.

According to at least one example embodiment, the generating of the standby mode body bias control signal may include reading voltage level information from a non-volatile memory to determine the standby mode body bias voltage to be applied to the semiconductor element; and generating the standby mode body bias control signal according to the voltage level information.

According to at least one example embodiment, the generating of the standby mode body bias voltage and the applying of the standby mode body bias voltage to the body of the semiconductor element may include generating the standby mode body bias voltage according to the standby mode body bias control signal; and turning off a plurality of transistors included in the semiconductor element according to the standby mode body bias voltage.

According to at least one example embodiment, a semiconductor device, comprises: a semiconductor element including a plurality of transistors; and a controller configured to control a voltage generator to selectively apply a voltage to the plurality of transistors such that values stored in at least some of the plurality of transistors are retained during a standby mode of the semiconductor element.

According to at least one example embodiment, the controller is configured to selectively apply the voltage to body terminals of the at least some of plurality of transistors if the values stored in the plurality of transistors are desired to be retained during the standby mode.

According to at least one example embodiment, the values retained in the at least some of the plurality of transistors correspond to information used to switch the semiconductor device from the standby mode to an active mode.

According to at least one example embodiment, the semiconductor device further comprises a non-volatile memory element configured to store voltage level information, and the controller is configured to use the voltage level information to apply one of a plurality of voltages as the voltage to the plurality of transistors, each of the plurality of voltages corresponding to an operation mode of the semiconductor device, the operation mode being one of at least the standby mode and an active mode.

According to at least one example embodiment, the controller includes a reset pad configured to apply a reset signal to the voltage generator before the voltage generator selectively applies the voltage to the plurality of transistors, and the reset pad is configured to apply a reset signal to the plurality of transistors after the voltage generator selectively applies the voltage to the plurality of transistors.

According to at least one example embodiment, the controller includes a standby pad configured to output a standby mode signal indicating the standby mode of the semiconductor element.

According to at least one example embodiment, the controller includes a standby register configured to store a standby mode bit that varies based on whether the semiconductor device is in the standby mode.

According to at least one example embodiment, the controller is configured to turn off the at least some of the plurality of transistors having values that are desired to be retained during the standby mode in response to the voltage generator selectively applying the voltage.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Figure 1:
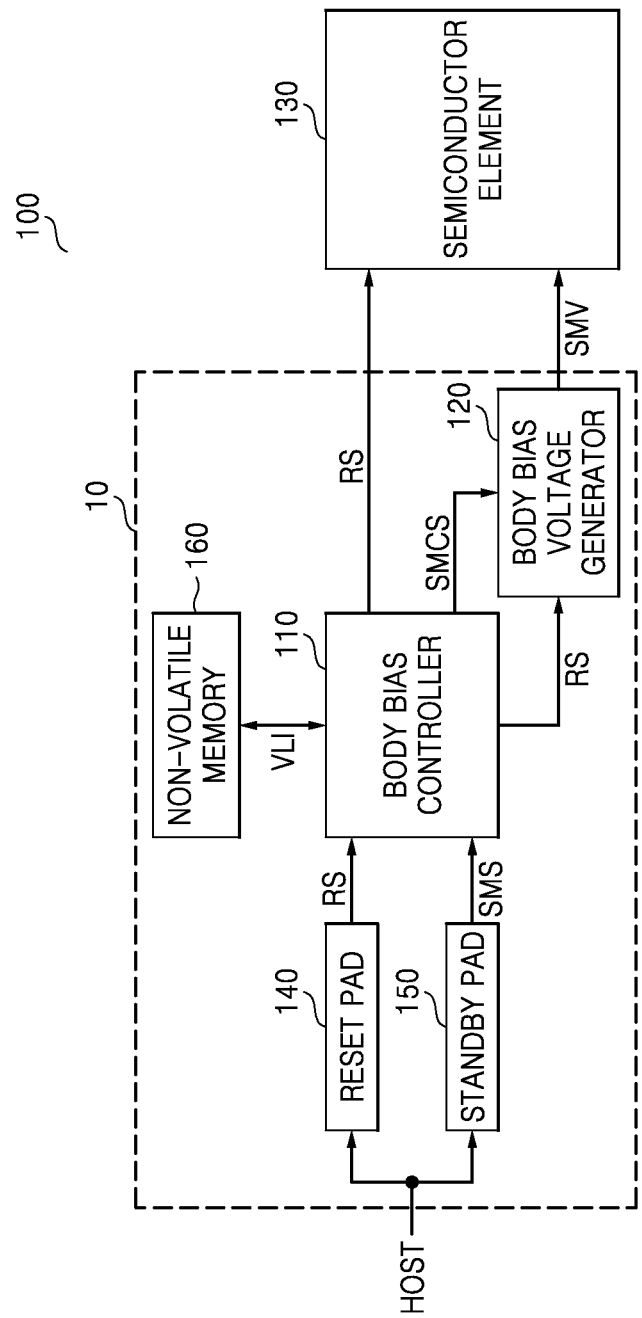
FIG. 1 is a block diagram of a semiconductor device according to at least one example embodiment of inventive concepts.

Example embodiments will be understood more readily by reference to the following detailed description and the accompanying drawings. Example embodiments may, however, be embodied in many different forms and should not be construed as being limited to those set forth herein. Rather, these example embodiments are provided so that this disclosure will be thorough and complete. Example embodiments should be defined by the appended claims. In at least some example embodiments, well-known device structures and well-known technologies will not be specifically described in order to avoid ambiguous interpretation.

It will be understood that when an element is referred to as being "connected to" or "coupled to" another element, it can be directly on, connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of example embodiments.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises," "comprising," "includes," and/or "including" when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Spatially relative terms, such as "below", "beneath", "lower", "above", "upper", and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

FIG. 1 is a block diagram of a semiconductor device 100 according to at least one example embodiment of inventive concepts. Referring to FIG. 1, the semiconductor device 100 includes a controller 10. The controller 10 includes a body bias controller 110, a body bias voltage generator 120, a semiconductor element 130, a reset pad 140, a standby pad 150, and a non-volatile memory 160. The semiconductor device 100 may be a memory device or a non-memory device.

Examples of the memory device include a volatile memory device and a non-volatile memory device. Examples of the volatile memory device include Dynamic Random Access Memory (DRAM), Static RAM (SRAM), Thyristor RAM (T-RAM), Zero capacitor RAM (Z-RAM), and Twin Transistor RAM (TTRAM).

Examples of the non-volatile memory device include Electrically Erasable Programmable Read-Only Memory (EEPROM), flash memory, Magnetic RAM (MRAM), Conductive Bridging RAM (CBRAM), Ferroelectric RAM (FeRAM), Phase-change RAM (PRAM), and Resistive RAM (RRAM or ReRAM). Examples of the non-memory device include a Central Processing Unit (CPU) of a computer, a micro-component, a logic device, an Application integrated circuit (ASIC), an analog IC (IC), a System On Chip (SOC), and a Network ON Chip (NOC).

Examples of the micro-component include a micro-processor, a micro-controller, a micro-peripheral, a digital signal processor, and the like. Examples of a logic device include a standard logic, a full-custom IC, and other logics. Examples of an ASIC include a cell-based IC, a Programmable Logic Device (PLD), a gate array, and the like.

The memory device and the non-memory device are just examples of the memory device to which inventive concepts may be applied, and inventive concepts may be applied to various types of semiconductor circuits having a standby mode.

The body bias controller 110 may control a body bias voltage and a reset signal RS to be applied to the semiconductor element 130. The body bias voltage may refer to a voltage applied to the bodies (e.g., body terminals) of a plurality of transistors included in the semiconductor element 130. Each of the transistors may be controlled according to the body bias voltage. In other words, a transistor may be controlled independently from a gate thereof, based on the body effect phenomenon that a threshold voltage of the transistor changes when a voltage $V_{SB}$ between a body and source of the transistor changes.

The body bias controller 110 may control the body bias voltage generator 120 to apply different voltages to the semiconductor element 130 in various operation modes, e.g., an active mode and/or the standby mode. The active mode may refer to a state in which the semiconductor device 100 performs a normal operation, and the standby mode may refer to a state in which power consumption is minimized according to a request from a user, or when an event indicating a desire to reduce power consumption occurs.

The body bias controller 110 may receive a reset signal RS from the reset pad 140, and transmit the reset signal RS to the semiconductor element 130 and the body bias voltage generator 120. The body bias controller 110 may receive a standby mode signal SMS from the standby pad 150 and generate a standby mode body bias control signal SMCS in response to the standby mode signal SMS. The standby mode signal SMS is generated by a host and indicates whether the standby mode is entered. The standby mode body bias control signal SMCS controls the body bias voltage generator 120 to apply a voltage for the standby mode to the semiconductor element 130.

The body bias controller 110 may determine the standby mode body bias control signal SMCS by reading voltage level information VLI from the non-volatile memory 160. The voltage level information VLI is generated by the body bias controller 110, and may contain information for determining a body bias voltage for each operation mode of the semiconductor device 100.

The body bias controller 110 may perform resetting therein according to the reset signal RS received from the reset pad 140. Upon receiving the reset signal RS from the reset pad 140, the body bias controller 110 immediately transmits the reset signal RS to the body bias voltage generator 120 and performs resetting therein. However, the body bias controller 110 may not transmit the reset signal RS to the semiconductor element 130 before the body bias voltage generator 120 completes setting of the standby mode body bias voltage SMV for the semiconductor element 130, i.e., before a voltage of the host becomes equal to a desired voltage. In the standby mode, the plurality of transistors included in the semiconductor element 130 may be reset. If the plurality of transistors included in the semiconductor element 130 is reset before the setting of the standby mode body bias voltage SMV for the semiconductor element 130 is completed, then values stored in transistors, the data retention of which is desired (or alternatively, required) from among the plurality of transistors included in the semiconductor element 130, may be lost.

Thus, the body bias controller 110 may transmit the reset signal RS to the semiconductor element 130 after the completion of setting of the standby mode body bias voltage SMV for the semiconductor element 130.

The phrase 'data retention' may refer to retaining values stored in transistors which contain information desired (or alternatively, required) for entering the active mode at a later time, even when a main power supply is shut down to reduce power consumption in the standby mode. The information desired (or, alternatively, required) for entering the active mode may include boot code for fast rebooting, user setting information for entering the standby mode, and the like.

The body bias voltage generator 120 may generate a body bias voltage for each mode under control of the body bias controller 110. For example, in the standby mode, the body bias voltage generator 120 may generate the standby mode body bias voltage SMV by receiving the standby mode body bias control signal SMCS from the body bias controller 110. The body bias voltage generator 120 may generate various voltages according to the standby mode body bias control signal SMCS, and apply the generated voltages to the plurality of transistors of the semiconductor element 130. The standby mode body bias voltage SMV applied to the plurality of transistors, the data retention of which is desired (or alternatively, required), may be selected from among voltages between 1.5 V and 2.5 V according to the characteristics of the transistors by using the body bias controller 110. Also, it is possible to optionally block current leaking from the transistors included in the semiconductor element 130 by using the standby mode body bias voltage SMV. The body bias voltage generator 120 may additionally include a switch (not shown) to change a voltage applied to the semiconductor element 130, that is, a body bias voltage applied to each of groups of transistors that are electrically connected to one another.

In the standby mode, the body bias voltage generator 120 may apply a body bias voltage to transistors, the data retention of which is desired (or alternatively, required), from among the plurality of transistors included in the semiconductor element 130. The body bias voltage generator 120 may turn off the transistors, the data retention of which is desired (or alternatively, required), by applying the body bias voltage to these transistors according to the standby mode body bias control signal SMCS. Thus, even if an external power supply is discontinued in the standby mode, values stored in these transistors may be retained. In other words, an additional memory or power control device is not required to retain the values stored in the transistors, the data retention of which is desired (or alternatively, required), in the standby mode.

In this way, it should be understood that the body bias controller 110 may be configured to control the body bias voltage generator 120 to selectively apply a voltage to the plurality of transistors such that values stored in at least some of the plurality of transistors are retained during a standby mode of the semiconductor element 130. Further, it should be understood that the voltage may be selectively applied to body terminals of the at least some of plurality of transistors if the values stored in the plurality of transistors are desired to be retained during the standby mode. The retained values may correspond to information used to switch the semiconductor device 100 from the standby mode to an active mode.

In contrast, the body bias voltage generator 120 turns on transistors, the data retention of which is not desired (or alternatively, not required), from among the plurality of transistors included in the semiconductor element 130 by applying an additional body bias voltage to these transistors. Thus, if an external power supply is discontinued in the standby mode, values stored in these transistors may be lost.

The body bias voltage generator 120 may perform resetting therein according to the reset signal RS received from the body bias controller 110. The body bias voltage generator 120 may be a complementary metal-oxide-semiconductor (CMOS)-based analog voltage generator but is not limited thereto.

Although not shown, the semiconductor element 130 may include a plurality of digital logic cells and a memory cell. A plurality of transistors included in the plurality of digital logic cells and the memory cell may be divided into at least two groups of transistors, the bodies of which are connected to one another. Different standby mode body bias voltages SMV may be applied to the at least two groups. That is, the bodies of transistors to which the same body bias voltage should be applied in the standby mode may be electrically connected from among the transistors included in the plurality of digital logic cells and the memory cell. Thus, the same body bias voltage may be applied from the body bias voltage generator 120 to the bodies of the transistors that are electrically connected, and these transistors may be turned off or on together in the standby mode.

The plurality of digital logic cells may include a Boolean gate, e.g., an AND gate, an OR gate, a NOT gate, an XOR (exclusive OR) gate, and/or an XNOR (exclusive NOR) gate. The memory cell may include a non-volatile memory and/or a volatile memory.

The semiconductor element 130 may further include an analog circuit besides the plurality of digital logic cells and the memory cell. The reset pad 140 may receive the reset signal RS from the host and deliver the reset signal RS to the body bias controller 110. The standby pad 150 may receive the standby mode signal SMS from the host and deliver the standby mode signal SMS to the body bias controller 110.

The non-volatile memory 160 may store body bias voltages corresponding to various operation modes of the semiconductor device 100. In particular, the non-volatile memory 160 may store voltage level information VLI for determining the standby mode body bias voltage SMV for the semiconductor element 130, which is generated by the body bias controller 110. In the standby mode, the non-volatile memory 160 may provide the voltage level information VLI to the body bias controller 110 according to a request from the body bias controller 110. The non-volatile memory 160 may retain information stored therein regardless of whether power is supplied to the non-volatile memory 160 or not. The memory 160 may be Electrically Erasable Programmable Read-Only Memory (EEPROM), flash memory, Magnetic RAM (MRAM), Conductive bridging RAM (CBRAM), Ferroelectric RAM (FeRAM), Phase-change RAM (PRAM), and/or Resistive RAM (RRAM or ReRAM), etc.

Accordingly, in a semiconductor device according to an example embodiment of inventive concepts, data stored in a semiconductor element may be retained and leakage current may be blocked by controlling the body bias voltage in the standby mode, thereby increasing the integration degree of the semiconductor device.

Figure 2:
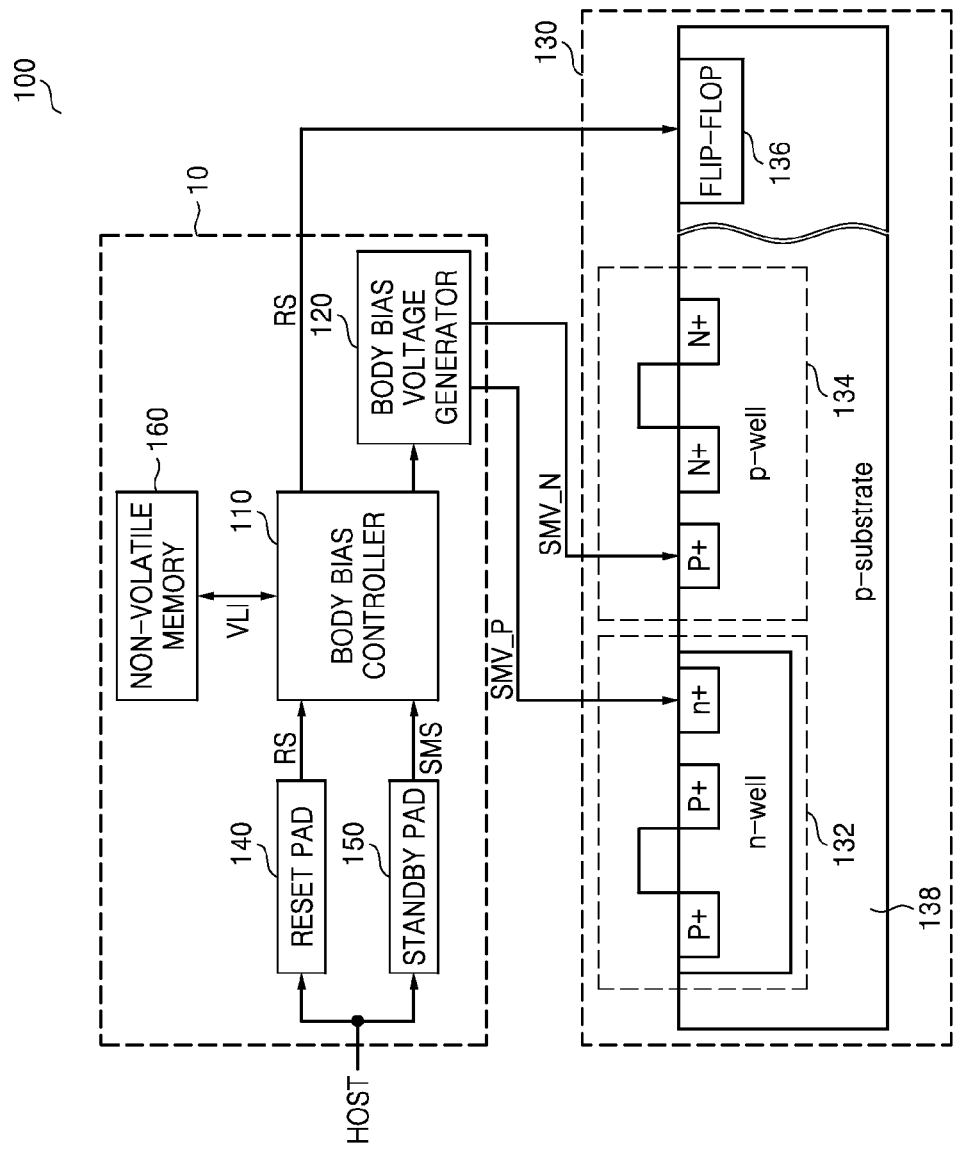
FIG. 2 is a block diagram illustrating applying a body bias voltage to a semiconductor element from a body bias voltage generator included in a semiconductor device, according to at least one example embodiment of inventive concepts.

FIG. 2 is a block diagram specifically illustrating applying a body bias voltage to the semiconductor element 130 from the body bias voltage generator 120 included in the controller 10 and the semiconductor device 100 of FIG. 1, according to at least one example embodiment of inventive concepts. Referring to FIG. 2, the semiconductor element 130 may include a plurality of digital logic cells and a memory cell. The plurality of digital logic cells and the memory cell may be embodied as a plurality of PMOS transistors 132, a plurality of NMOS transistors 134, and a plurality of flip-flops 136. The plurality of flip-flops 136 may be embodied as a plurality of logic gates including PMOS transistors and/or NMOS transistors.

In the standby mode, some NMOS transistors may be electrically disconnected from one another to be supplied a body bias voltage SMV_N from the body bias voltage generator 120, according to whether data retention thereof is required. The same body bias voltage SMV_N is not applied to all of the NMOS transistors, and different voltages may be applied to the NMOS transistors according to a process or if desired (or alternatively, required). Some of the NMOS transistors may be electrically disconnected from one another by additionally forming p-wells in a p-type substrate 138, but inventive concepts are not limited thereto.

Similarly, in the standby mode, PMOS transistors, the data retention of which is desired (or alternatively, required), may be supplied a body bias voltage SMV_P from the body bias voltage generator 120. The same body bias voltage SMV_P is not applied to all of the PMOS transistors, and different voltages may be applied to the PMOS transistors according to a process or if desired (or alternatively, required). For convenience of explanation, the p-type substrate 138 is used in FIG. 2, but according to another example embodiment of inventive concepts, an n-type substrate may be used.

The plurality of flip-flops 136 may be reset by receiving a reset signal RS from the body bias controller 110 after completion of setting a standby mode body bias voltage for the semiconductor element 130. The plurality of flip-flops 136 may include PMOS transistors and/or NMOS transistors, the data retention of which is desired (or alternatively, required) in the standby mode, and may thus be reset after the completion of setting a standby mode body bias voltage for the semiconductor element 130.

Figure 3:
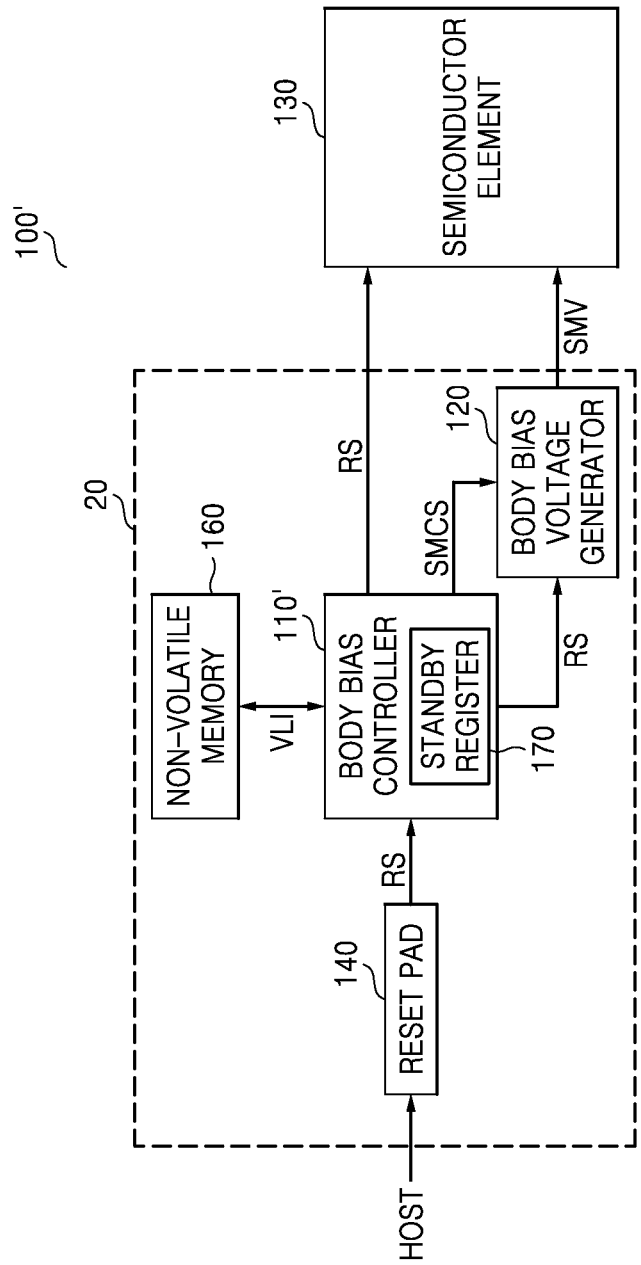
FIG. 3 is a block diagram of a semiconductor device according to at least one example embodiment of inventive concepts.

FIG. 3 is a block diagram of a semiconductor device 100' according to at least one example embodiment of inventive concepts. Referring to FIG. 3, the semiconductor device 100' may include a controller 20. The controller 20 may include body bias controller 110', a body bias voltage generator 120, a semiconductor element 130, a reset pad 140, and a non-volatile memory 160, similar to the semiconductor device 100 of FIG. 1. However, compared to the semiconductor device 100 of FIG. 1, the semiconductor device 100' may not include the standby pad 150, and instead, the body bias controller 110 may include a standby register 170.

The standby register 170 may sense whether the semiconductor device 100' enters the standby mode. The standby register 170 may store a standby mode bit that varies according to whether the semiconductor device 100' enters the standby mode. For example, the standby mode may be enabled when the standby mode bit has a logic value '1', and may be disabled when the standby mode bit has a logic value '0'.

The body bias controller 110 may vary the standby mode bit stored in the standby register 170 to enable the standby mode, if a signal containing information indicating that the standby mode is to be enabled is received from a host, or if a timer (not shown) included in the body bias controller 110 senses that this signal is not received from the host within a desired (or alternatively, predetermined) time period.

Figure 4:
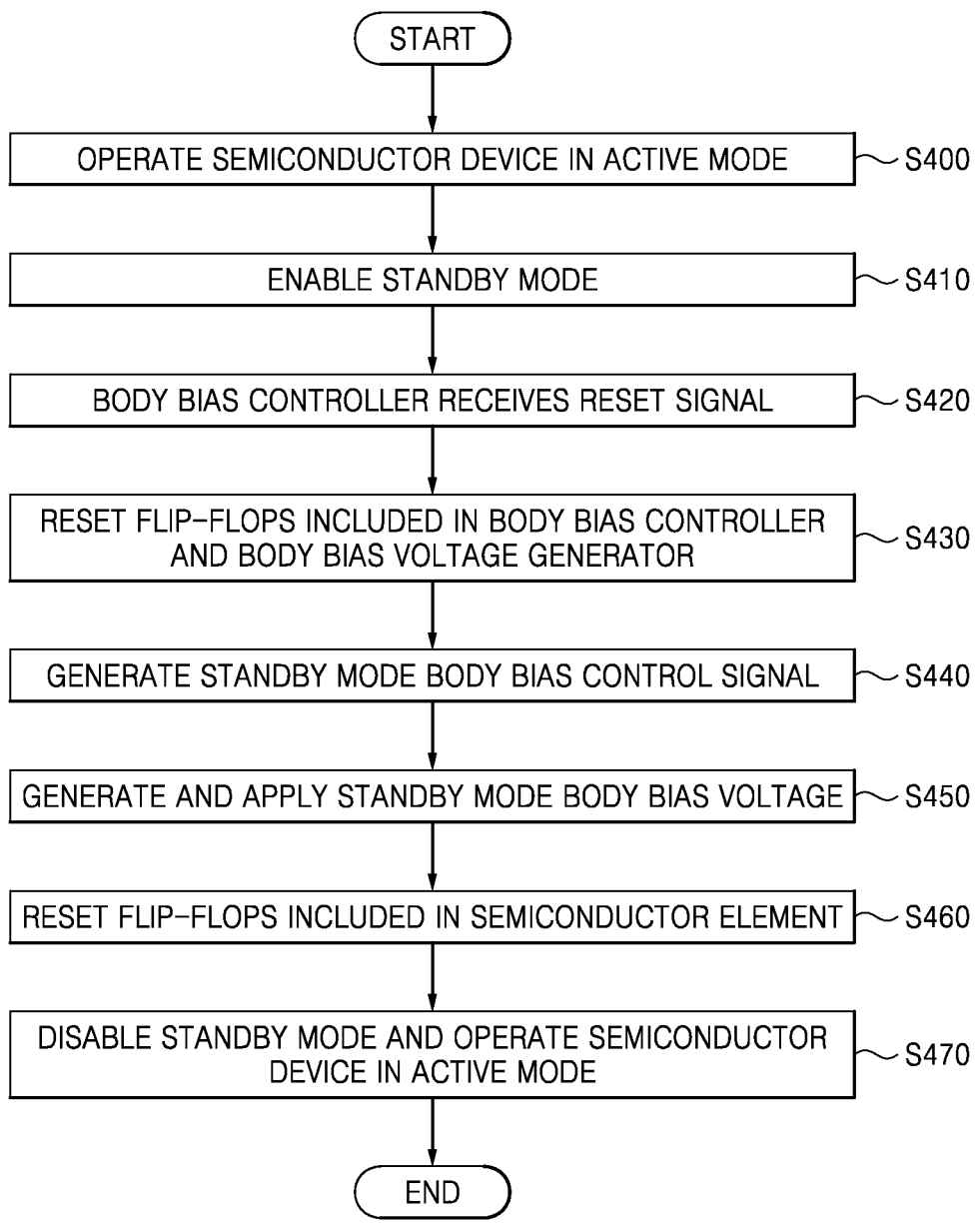
FIG. 4 is a flowchart illustrating a method of controlling standby mode body biasing, according to at least one example embodiment of inventive concepts.

FIG. 4 is a flowchart illustrating a method of controlling standby mode body biasing, according to at least one example embodiment of inventive concepts. Referring to FIGS. 2 to 4, when the semiconductor device 100 or 100' operates in the active mode, the body bias voltage generator 120 may apply an active mode body bias voltage to the semiconductor element 130 under control of the body bias controller 110 (operation S400). The active mode body bias voltage is applied to the plurality of transistors included in the semiconductor element 130 when the semiconductor device 100 or 100' operates in the active mode.

When the semiconductor device 100 or 100' is desired to enter the standby mode, the standby mode may be enabled (operation S410). The standby mode may be enabled according to the standby mode enable signal received via the standby pad 150 of FIG. 2 and/or also by the standby register 170 of FIG. 3. Referring to FIG. 2, the standby mode enable signal generated by a host may be supplied to the body bias controller 110 via the reset pad 140 and the standby pad 150 so as to enable the standby mode. The standby mode enable signal is a type of the standby mode signal SMS generated by the host. The standby mode enable signal forms the standby mode signal SMS together with a standby mode disable signal so as to indicate whether the semiconductor device 100 or 100' enters the standby mode. Referring to FIG. 3, the standby mode may be enabled by a standby mode bit, which is stored in the standby register 170 and varies according to whether the semiconductor device 100 or 100' enters the standby mode.

Then, the body bias controller 110 may receive a reset signal RS from the host via the reset pad 140 (operation S420). The reset signal RS may be received when the semiconductor device 100 or 100' initially operates, and may be received when the standby mode is enabled. Alternatively, the reset signal RS may be received at a time before or after the standby mode is enabled.

The body bias controller 110 may transmit the reset signal RS to the body bias voltage generator 120 as soon as receiving the reset signal RS. Then, each of the body bias controller 110 and body bias voltage generator 120 may reset a plurality of flip-flops therein (operation S430).

Then, when the standby mode is enabled, the body bias controller 110 may generate a standby mode body bias control signal SMCS and transmit the standby mode body bias control signal SMCS to the body bias voltage generator 120 (operation S440). As described above, the standby mode body bias control signal SMCS controls the body bias voltage generator 120 to apply a voltage for the standby mode to the semiconductor element 130.

Then, the body bias voltage generator 120 may set a standby mode body bias voltage SMV for the semiconductor element 130 according to the standby mode body bias control signal SMCS received from the body bias controller 110 (operation S450). Operations S440 and S450 are described in detail with reference to FIG. 5 below.

After completing the setting of the standby mode body bias voltage SMV for the semiconductor element 130, the body bias controller 110 may transmit the reset signal RS to the semiconductor element 130. The body bias controller 110 may receive a feedback from the body bias voltage generator 120 indicating whether the setting of the standby mode body bias voltage SMV for the semiconductor element 130 is completed, or may determine whether the setting of the standby mode body bias voltage SMV for the semiconductor element 130 is completed based on counting of the timer (not shown) included in the body bias controller 110. Then, when the semiconductor element 130 receives the reset signal RS, the plurality of flip-flops 136 included in the semiconductor element 130 may be reset (operation S460). The plurality of flip-flops 136 may include PMOS transistors and/or NMOS transistors, the data retention of which is desired (or alternatively, required) in the standby mode. Thus, the plurality of flip-flops 136 may be reset after completion of setting the standby mode body bias voltage SMV for the semiconductor element 130.

Then, when the body bias controller 110 receives the standby mode disable signal from the host via the standby pad 150 or when the standby mode bit stored in the standby register 170 varies, the body bias controller 110 may control the body bias voltage generator 120 to apply the active mode body bias voltage to the semiconductor element 130 (operation S470). The active mode body bias voltage may be different from the standby mode body bias voltage SMV.

Here, the resetting of the body bias controller 110 and the body bias voltage generator 120 (operation S430) and the resetting of the semiconductor element 130 (operation S460) may not be needed and may thus be skipped when the semiconductor device 100 or 100' enters the standby mode during a normal operation of the system.

Figure 5:
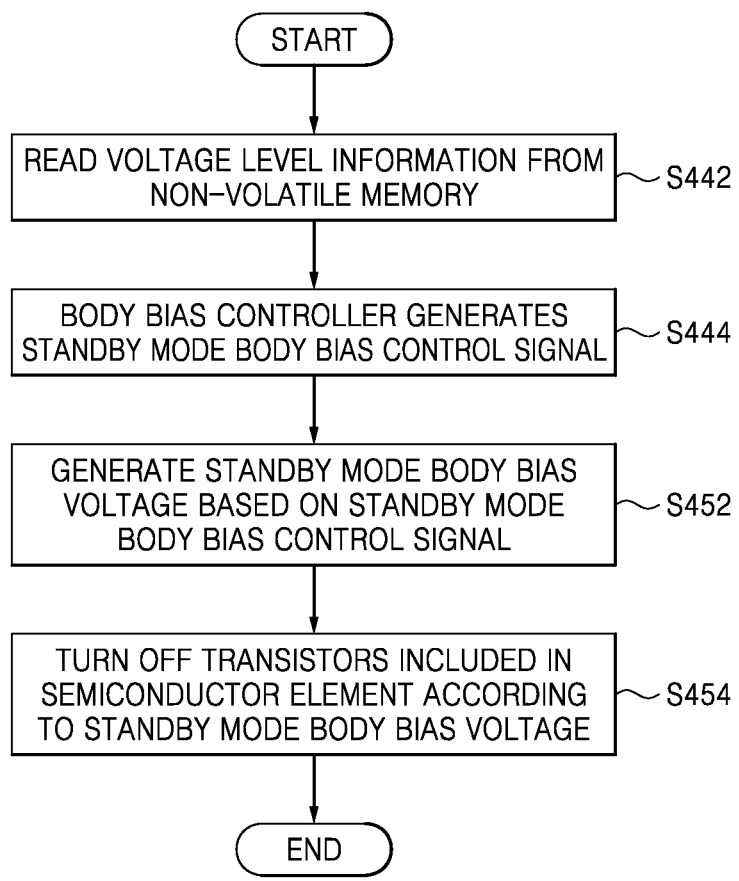
FIG. 5 is a flowchart illustrating operations of generating a standby mode body bias control signal and setting a standby mode body bias voltage, which are included in the method of FIG. 4, according to at least one example embodiment of inventive concepts.

FIG. 5 is a flowchart illustrating the operations of generating a standby mode body bias control signal SMCS and setting a standby mode body bias voltage SMV, which are included in the method of FIG. 4, according to at least one example embodiment of inventive concepts. Referring to FIGS. 2 to 5, when the resetting of the flip-flops included in the body bias controller 110 and the body bias voltage generator 120 is completed, the body bias controller 110 may read voltage level information VLI from the non-volatile memory 160 (operation S442). The voltage level information VLI may include information for determining a body bias voltage for each operation mode of the semiconductor device 100 or 100'.

Then, the body bias controller 110 may generate a standby mode body bias control signal SMCS and transmit the standby mode body bias control signal SMCS to the body bias voltage generator 120 based on the read voltage level information VLI (operation S444). The standby mode body bias control signal SMCS is a signal containing code for controlling the body bias voltage generator 120 to apply a voltage for the standby mode to the semiconductor element 130.

Then, the body bias voltage generator 120 may receive the standby mode body bias control signal SMCS, and generate the standby mode body bias voltage SMV based on the standby mode body bias control signal SMCS (operation S452). The standby mode body bias voltage SMV may be applied to the PMOS transistors and NMOS transistors of the plurality of digital logic cells and the memory cell included in the semiconductor element 130.

When the data retention of the PMOS transistors and NMOS transistors of the plurality of digital logic cells and the memory cell included in the semiconductor element 130 is desired (or alternatively, required), the PMOS transistors and NMOS transistors may be turned off according to the standby mode body bias voltage SMV (operation S454). In other words, the body bias voltage generator 120 may turn off the PMOS transistors and NMOS transistors, the data retention of which is desired (or alternatively, required) by applying a body bias voltage to these transistors according to the standby mode body bias control signal SMCS thereto, so that values stored in these transistors may be retained even when power supply is discontinued in the standby mode. In this case, it is also possible to selectively block current leaking from the transistors included in the semiconductor element 130 in the standby mode.

Figure 6:
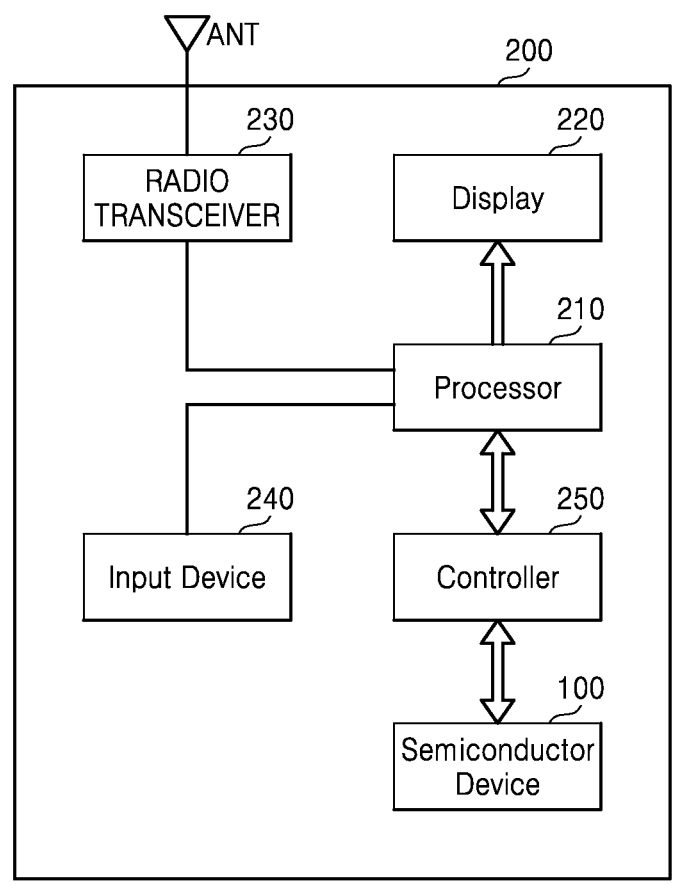
FIG. 6 is a block diagram of a semiconductor system including a semiconductor device illustrated in FIG. 1 or 3, according to at least one example embodiment of inventive concepts.

FIG. 6 is a block diagram of a semiconductor system 200 including the semiconductor device 100 or 100' of FIG. 1 or 3, according to at least one example embodiment of inventive concepts. Specifically, FIG. 6 illustrates a case where the semiconductor device 100 or 100' of FIG. 1 or 3 is included in the semiconductor system 200. The semiconductor system 200 may be a cellular phone, a smart phone, a tablet personal computer (PC), a personal digital assistant (PDA), a wireless communication device, etc.

The semiconductor system 200 includes the semiconductor device 100 or 100', and a controller 250 that controls an operation of the semiconductor device 100 or 100'. The controller 250 may control a data access operation of the semiconductor device 100 or 100', e.g., a program operation, an erase operation, or a read operation, under control of a processor 210.

The page data programmed in the semiconductor device 100 or 100' may be displayed through a display 220 according to the control of the processor 210 and/or the memory controller 250.

A radio transceiver 230 transmits and/or receives radio signals through an antenna ANT. The radio transceiver 230 may convert radio signals received through the antenna ANT into signals that can be processed by the processor 210. Accordingly, the processor 210 may process the signals output from the radio transceiver 230 and transmit the processed signals to the memory controller 250 or the display 220. The memory controller 250 may program the signals processed by the processor 210 to the semiconductor device 100 or 100'. The radio transceiver 230 may also convert signals output from the processor 210 into radio signals and output the radio signals to an external device through the antenna ANT.

An input device 240 enables control signals for controlling the operation of the processor 210 and/or data to be processed by the processor 210 to be input to the semiconductor system 200. The input device 240 may be implemented by a pointing device such as a touch pad or a computer mouse, a keypad, a keyboard, etc.

The processor 210 may control the operation of the display 220 to display data output from the memory controller 250, data output from the radio transceiver 230, or data output from the input device 240. The memory controller 250, which controls the operations of the semiconductor device 100 or 100', may be implemented as a part of the processor 210 or as a separate chip.

Figure 7:
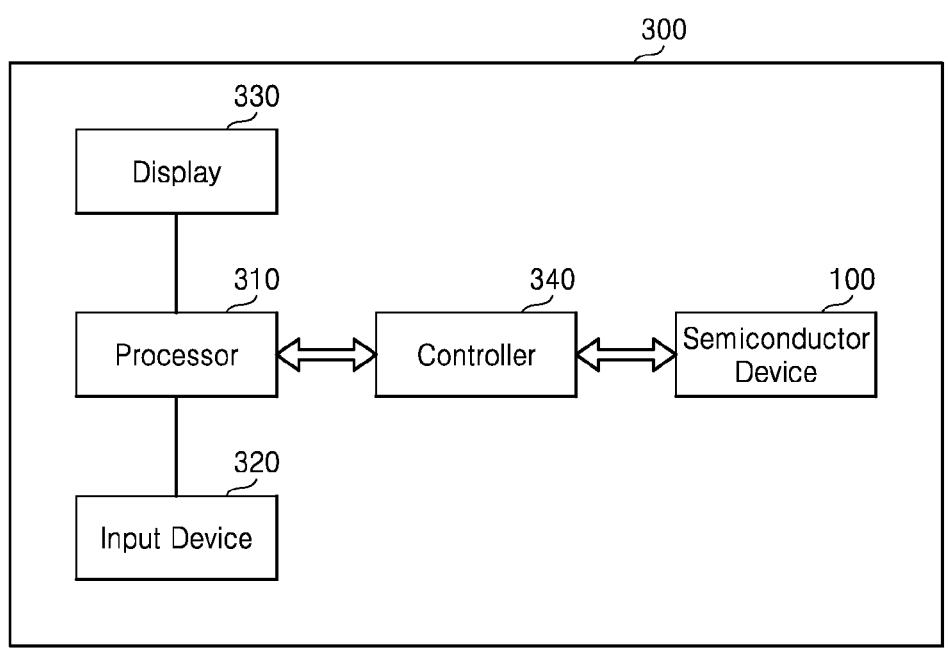
FIG. 7 is a block diagram of a semiconductor system including a semiconductor device illustrated in FIG. 1 or 3, according to at least one example embodiment of inventive concepts.

FIG. 7 is a block diagram of a semiconductor system 300 including a semiconductor device 100 or 100' illustrated in FIG. 1 or 3, according to at least one example embodiment of inventive concepts. The semiconductor system 300 may be implemented as a personal computer (PC), a tablet PC, a net-book, an e-reader, a personal digital assistant (PDA), a portable multimedia player (PMP), an MP3 player, an MP4 player, etc.

The semiconductor system 300 includes the semiconductor device 100 or 100' and a memory controller 340 controlling the data processing operations of the semiconductor device 100 or 100'. A processor 310 may display data stored in the semiconductor device 100 or 100' through a display 330 according to data input through an input device 320. The input device 320 may be implemented by a pointing device such as a touch pad or a computer mouse, a keypad, a keyboard, etc.

The processor 310 may control the overall operation of the semiconductor system 300 and the operations of the memory controller 340. The memory controller 340, which may control the operations of the semiconductor device 100 or 100', may be implemented as a part of the processor 310 or as a separate chip.

Figure 8:
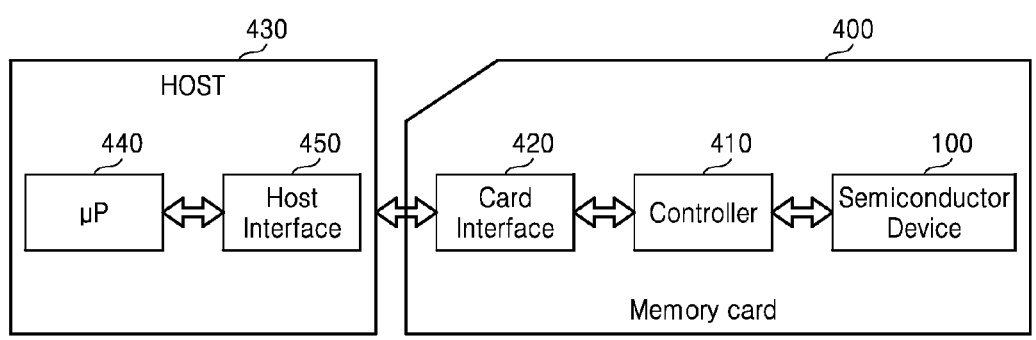
FIG. 8 is a block diagram of a semiconductor system including a semiconductor device illustrated in FIG. 1 or 3, according to at least one example embodiment of inventive concepts.

FIG. 8 is a block diagram of a semiconductor system 400 including the semiconductor device 100 or 100' illustrated in FIG. 1 or 3, according to further embodiments of the inventive concept. The semiconductor system 400 may be implemented as a memory card or a smart card. The semiconductor system 400 includes the semiconductor device 100 or 100', a memory controller 410, and a card interface 420.

The memory controller 410 may control data exchange between the semiconductor device 100 or 100' and the card interface 420. The card interface 420 may be a secure digital (SD) card interface or a multi-media card (MMC) interface, but inventive concepts are not limited thereto.

The card interface 420 may communicate with a host 430 and the memory controller 410 for data exchange according to a protocol of the host 430. The card interface 420 may support a universal serial bus (USB) protocol and/or an inter-chip (IC)-USB protocol. Here, the card interface 420 may indicate a hardware supporting a protocol used by the host 430, software installed in the hardware, and/or a signal transmission mode.

When the semiconductor system 400 is connected with the host 430 such as a PC, a tablet PC, a digital camera, a digital audio player, a cellular phone, a console video game hardware, a digital set-top box, etc., a host interface 450 may perform data communication with the semiconductor device 100 or 100' through the card interface 420 and the memory controller 410 according to the control of a microprocessor 440.

Figure 9:
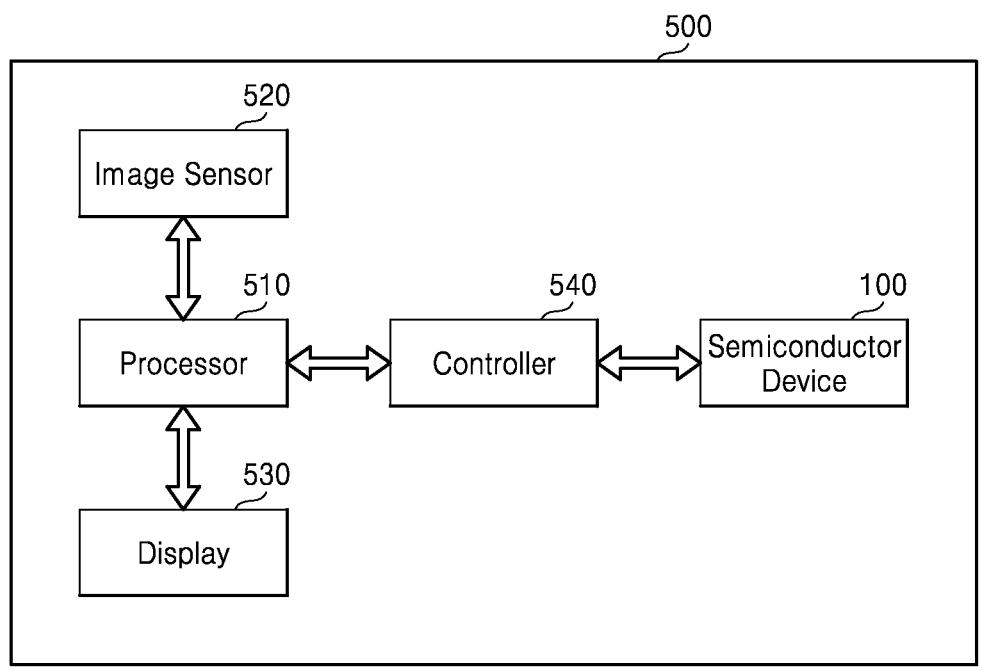
FIG. 9 is a block diagram of a semiconductor system including a semiconductor device illustrated in FIG. 1 or 3, according to at least one example embodiment of inventive concepts.

FIG. 9 is a block diagram of a semiconductor system 500 including the semiconductor device 100 or 100' illustrated in FIG. 1 or 3, according to at least one example embodiment of inventive concepts. The semiconductor system 500 may be implemented as an image processor such as a digital camera, a cellular phone equipped with a digital camera, a smart phone equipped with a digital camera, a tablet PC equipped with a digital camera, etc.

The semiconductor system 500 includes the semiconductor device 100 or 100' and a memory controller 540 controlling the data processing operations, such as a program operation, an erase operation, and a read operation, of the semiconductor device 100 or 100'. An image sensor 520 included in the semiconductor system 500 converts optical images into digital signals and outputs the digital signals to a processor 510 or the memory controller 540. The digital signals may be controlled by the processor 510 to be displayed on a display 530 or stored in the semiconductor device 100 or 100' through the memory controller 540.

Data stored in the semiconductor device 100 or 100' may be displayed through the display 530 according to the control of the processor 510 or the memory controller 540. The memory controller 540, which may control the operations of the semiconductor device 100 or 100', may be implemented as a part of the processor 510 or as a separate chip.

Figure 10:
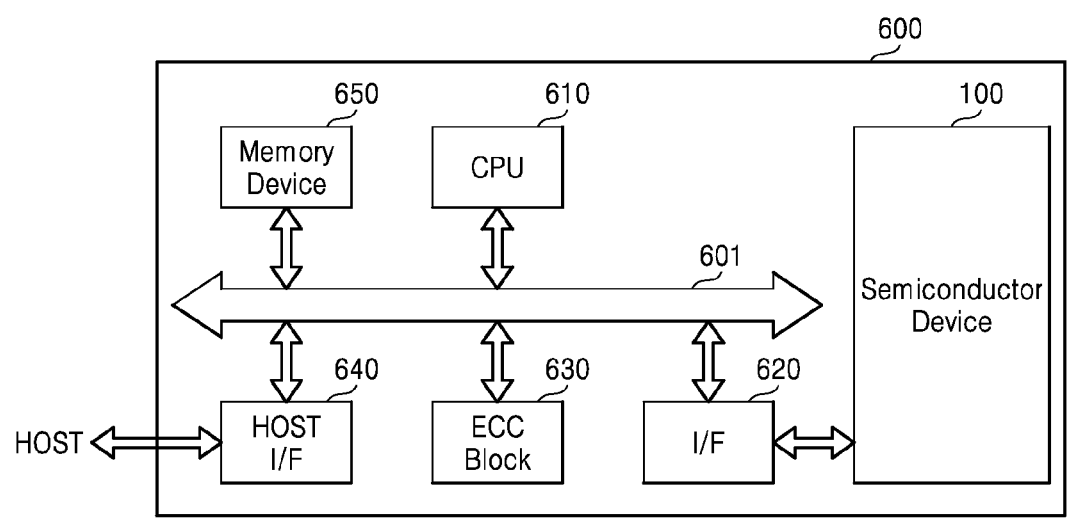
FIG. 10 is a block diagram of a semiconductor system including a semiconductor device illustrated in FIG. 1 or 3, according to at least one example embodiment of inventive concepts.

FIG. 10 is a block diagram of a semiconductor system 600 including the semiconductor device 100 or 100' illustrated in FIG. 1 or 3, according to at least one example embodiment of inventive concepts. Referring FIG. 10, the semiconductor system 600 includes the semiconductor device 100 or 100' and a central processing unit (CPU) 610 controlling the operations of the semiconductor device 100 or 100'.

The semiconductor system 600 also includes a memory device 650 that may be used an operation memory of the CPU 610. The memory device 650 may be implemented by a non-volatile memory such as read-only memory (ROM) or a volatile memory such as static random access memory (SRAM). A host connected with the semiconductor system 600 may perform data communication with the semiconductor device 100 or 100' through an interface 620 and a host interface 640.

An error correction code (ECC) block 630 is controlled by the CPU 610 to detect an error bit included in data output from the semiconductor device 100 or 100' through the interface 620, correct the error bit, and transmit the error-corrected data to the host through the host interface 640. The CPU 610 may control data communication among the interface 620, the ECC block 630, the host interface 640, and the memory device 650 through a bus 601. The semiconductor system 600 may be implemented as a flash memory drive, a USB memory drive, an IC-USB memory drive, a memory stick, etc.

Inventive concepts may also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, optical data storage devices, etc.

The computer-readable recording medium may also be distributed over network coupled computer systems so that the computer-readable code is stored and executed in a distributed fashion. Also, functional programs, codes, and code segments to accomplish inventive concepts can be easily construed by programmers.

A semiconductor device according to at least one example embodiment the inventive concepts is capable of retaining data stored in a semiconductor element and blocking leakage current in the standby mode by controlling a body bias voltage, thereby increasing the integration degree of the semiconductor device.

While inventive concepts have been particularly shown and described with reference to exemplary embodiments thereof, it will be understood that various changes in form and details may be made therein without departing from the spirit and scope of the following claims.

What is claimed is:

1. A semiconductor device comprising:
   a semiconductor element;
   a body bias controller configured to generate a standby mode body bias control signal in a standby mode and receive a reset signal from a host; and
   a body bias voltage generator configured to receive the standby mode body bias control signal from the body bias controller, generate a standby mode body bias voltage based on the standby mode body bias control signal, and apply the standby mode body bias voltage to a body of the semiconductor element, wherein the body bias controller is configured to supply the reset signal to the semiconductor element after the applying of the standby mode body bias voltage to the body of the semiconductor element is completed.

2. The semiconductor device of claim 1, further comprising:
   a non-volatile memory configured to store voltage level information, the voltage level information being generated by the body bias controller and being used to determine the standby mode body bias voltage to be applied to the semiconductor element.

3. The semiconductor device of claim 1, further comprising:
   a reset pad configured to receive the reset signal from the host.

4. The semiconductor device of claim 1, further comprising:
   a standby pad configured to receive a standby mode signal from the host, the standby mode signal indicating whether the standby mode is entered.

5. The semiconductor device of claim 1, further comprising:
   a standby register configured to store a standby mode bit that varies according to whether the semiconductor device enters the standby mode.

6. The semiconductor device of claim 1, wherein
   a plurality of transistors included in the semiconductor element is divided into at least two groups of transistors, the bodies of each transistor in the at least two groups of transistors being connected to one another, and
   different standby mode body bias voltages are applied to each group of the at least two groups of transistors.

7. The semiconductor device of claim 1, wherein the standby mode body bias voltage is different from an active mode body bias voltage, the active mode body bias voltage being applied in an active mode.

8. A computer system including the semiconductor device of claim 1.

* * * * *